United States Patent [19]

Levin

[11] 4,134,025
[45] Jan. 9, 1979

[54] ELECTRIC SWITCH ARRANGEMENT FOR USE AS A CURRENT SUPPLY SWITCHING MEANS FOR A BIPOLAR ELECTRIC LOAD

[75] Inventor: Peter E. Levin, Sundbyberg, Sweden

[73] Assignee: K E Levin Maskin AB, Stockholm, Sweden

[21] Appl. No.: 799,981

[22] Filed: May 24, 1977

[30] Foreign Application Priority Data

Jun. 1, 1976 [SE] Sweden .............................. 7606121

[51] Int. Cl.² .......................................... H01H 83/00
[52] U.S. Cl. .................................... 307/125; 340/644; 361/190
[58] Field of Search .............. 307/112, 113, 114, 115, 307/125, 149, 126, 130, 131; 361/86, 87, 190, 189; 340/248 A, 253 H

[56] References Cited

U.S. PATENT DOCUMENTS 3,195,018  7/1965  Giger .................................. 361/190

*Primary Examiner*—Robert K. Schaefer
*Assistant Examiner*—Morris Ginsburg
*Attorney, Agent, or Firm*—Fleit & Jacobson

[57] ABSTRACT

An electric switch arrangement for use as a current supply switching means for a bipolar electric load is disclosed, comprising two switches connected in series with each other and with the load and located on opposite sides of the load. A monitoring equipment is provided for supervising the operation and function of said switches. Said monitoring equipment comprises potential generating means which are arranged, when both said switches are open, to generate at each pole of the load a potential deviating from the potential existing at said pole when anyone of said switches is closed or both said switches are closed, and sensing means which are arranged to sense the potential of at least one of the poles of the load.

5 Claims, 3 Drawing Figures

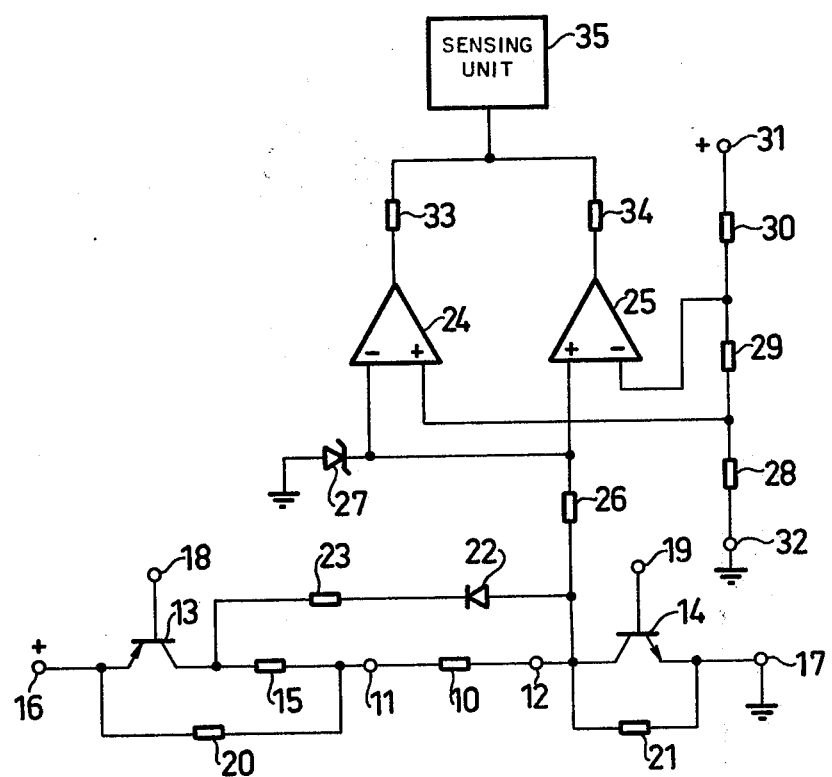

ELECTRIC SWITCH ARRANGEMENT FOR USE AS A CURRENT SUPPLY SWITCHING MEANS FOR A BIPOLAR ELECTRIC LOAD

The present invention relates to an electric switch arrangement for use as a current supply switching means for a bipolar electric load, said arrangement being of the kind comprising two switches which are conncted in series with each other and with the load and which are located on opposite sides of the load. It is to be understood that the two switches may be of any suitable type. Thus, the switches may be of the type relying on mechanical contact functions, although electronic switches of semiconductor type, for instance transistors, are preferred.

The reason for using two switches connected in series with each other instead of a single switch is that it is possible hereby to reduce the risk of unintentional supply of feeding current to the load, for instance as a consequence of a short-circuiting in said single switch. Such an improved safety against unintentional current supply to an electric load is desirable in many cases, for instance when the load is formed by the winding of an electromagnet or a solenoid valve used as a control means for a press or other cyclically operating machine, where an unintentional start of an operating cycle may have fatal consequences. By placing the two switches on opposite sides of the load it is possible to achieve the additional advantage that the load will be separated from the utilized current source at both ends thereof when the switches are open. This means that if for instance a live wire should come into contact with any of the poles of the load, any current will still not pass through the load as long as the switch connected to the opposite pole of the load is open.

An object of the invention is to provide an improved electric switch arrangement of the kind initially described permitting a continuous supervision of the function and operation of the arrangement. For this purpose, the invention provides an electric switch arrangement of said kind provided with a monitoring equipment for supervising the operation and function of the two switches, said monitoring equipment comprising potential generating means which are arranged, when both said switches are open, to generate at each pole of the load a potential deviating from the potential existing at said pole when anyone of said switches is closed or both said switches are closed, and sensing means which are arranged to sense the potential of at least one of the poles of the load.

The potential generating means may preferably include a voltage dividing circuit in which the load is connected.

The sensing means may be arranged for absolute measurement of the sensed potential. However, the sensing means may preferably include reference potential means for generating at least one reference potential and comparator means for comparing the sensed potential of at least one pole of the load with the reference potential. In this case, the function of the arrangement may be supervised by checking that the sensed potential does not deviate to an inadmissable extent from the corresponding reference potential when the two switches are open, i.e. in a non-conducting state.

The arrangement may also include means for checking the function of the monitoring equipment. The checking means may be formed by the sensing means. The function of the monitoring equipment may then be checked simply by ascertaining that the potential at each pole of the load assumes different values depending on whether the switches are open or closed.

If the load is of an inductive type, it may be sufficient to sense the potential at only one of the two poles of the load. The function of the switch connected to said pole may then be checked simply by controlling that said pole assumes different potentials depending on whether the switches are open or closed. The function of the other switch may be checked by controlling the change in potential at said pole occurring shortly after the current supply to the load has been broken by the switches and caused by the counter electromotive force then generated in the inductive load.

Below the invention will be described in further detail, reference being had to the accompanying drawings, in which:

FIG. 1 shows a circuit diagram illustrating an electric switch arrangement according to a first embodiment of the invention;

FIG. 2b shows a logical circuit diagram illustrating a set of logical circuits utilized to control and monitor the switch arrangement of FIG. 2a.

Figure 2A:
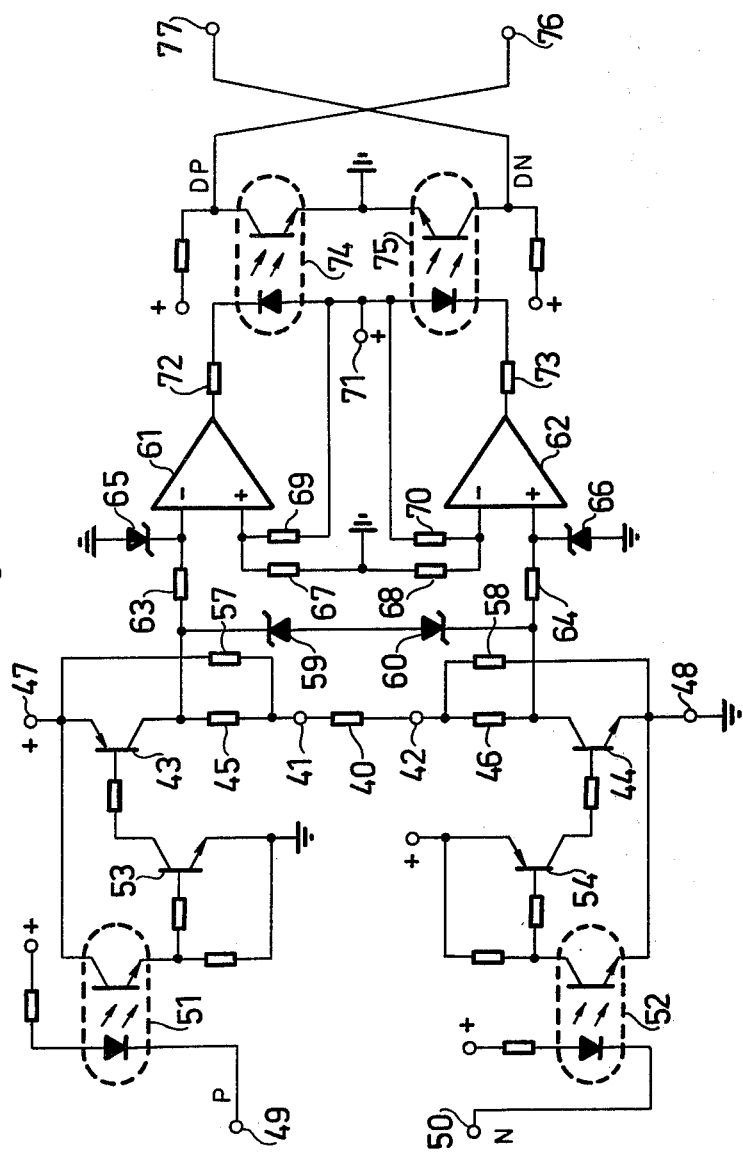
FIG. 2a shows a switch arrangement according to an alternative embodiment of the invention.

In FIG. 1 reference numeral 10 designates a bipolar electric load which preferably may be of inductive type and consist, for instance, of the winding of an electromagnet or a solenoid valve. Via two terminals 11 and 12, the load 10 is connected in a series circuit comprising, in addition to load 10, two transistors 13 and 14, located on opposite sides of the load 10 and serving as switches, and a resistor 15, connected between load 10 and transistor 13. At its ends said series circuit has two terminals 16 and 17, of which terminal 16 is intended to be connected to the positive pole of a DC voltage source (not shown) serving as current supply of the load, while terminal 17 is connected to earth. Also the negative pole of said DC voltage source is assumed to be connected to earth. The base electrodes of transistors 13 and 14 are connected each to one terminal 18 and 19, respectively. From pilot circuits (not shown) synchronous pilot signals may be delivered to terminals 18 and 19 to cause the two transistors 13 and 14 to shift between a non-conducting and a conducting state in response to the desired state of the load 10, i.e. depending on whether the load is intended to be supplied with current or not. Resistor 15 serves to limit the current through transistors 13 and 14 in case of any short-circuiting of the load 10 and to reduce the rise time if the load is of inductive type.

Another resistor 20 is connected between the two terminals 11 and 16 parallel to transistor 13 and resistor 15, while still another resistor 21 is connected between terminals 12 and 17, i.e. parallel to transistor 14. Together with the load 10, the two resistors 20 and 21 form a voltage dividing circuit, which determines the potential at the two poles of the load 10, i.e. at terminals 11 and 12, when the two transistors 13 and 14 are non-conductive. The resistance of each resistor 20 and 21 is much higher than the resistance of load 10, meaning that the current passing through the load 10 will be very low as long as the two transistors 13 and 14 are in a non-conducting state. Provided that resistors 20 and 21 have approximately equal resistance values, the potential at each terminal 11 and 12, i.e. at each pole of load 10, will then lie at values approximately half-way between the potentials existing at the two terminals 16 and 17 connected to the DC voltage source.

Parallel to load 10 and resistor 15, there is provided a diode 22 having a resistor 23 connected in series therewith. Diode 22 and resistor 23 are intended to limit the counter electromotive force generated in the load 10 when transistors 13 and 14 are shifted from a conducting to a non-conducting state, provided that the load is of an inductive type.

In order to sense the potential at the pole of load 10 connected to terminal 12, sensing means are provided comprising two operational differential amplifiers 24 and 25. The minus input of amplifier 24 and the plus input of amplifier 25 are both connected to terminal 12 via a resistor 26. A zener diode 27 is connected between earth and the junction between resistor 26 and said inputs of amplifiers 24 and 25 to restrict the voltage on said amplifier inputs when the two transistors 13 and 14 are shifted from a conducting to a non-conducting state. Resistor 26 serves to cause a voltage drop across the same during said moment. Reference numerals 28, 29 and 30 designate three resistors which are connected in series with each other and extend between two terminals 31 and 32. Terminal 31 is intended to be connected to the positive pole of the DC voltage source previously mentioned, while terminal 32 is connected to earth. The three resistors 28, 29 and 30 together form a voltage divider functioning as a reference voltage source. The junction between resistors 28 and 29 is connected to the plus input of amplifier 24, while the junction between resistors 29 and 30 is connected to the minus input of amplifier 25. Via a resistor 33 and 34, respectively, the output of each amplifiers 24 and 25, respectively, is connected to a common input of a sensing unit 35 which serves to sense whether the output signals from both amplifiers are low or whether the output signal from any of the two amplifiers is high.

The manner of operation of the arrangement above described will now be explained in further detail. The resistances of the three resistors 28, 29 and 30, which function as a reference voltage source, are selected so as to cause the potential at the junction between resistors 28 and 29, i.e. on the plus input of amplifier 24, to define a suitable lowest permissible limit value $U_1$ for the potential $u_{12}$ at terminal 12 when the two transistors 13 and 14 are non-conductive and no substantial current passes through the load 10. The resistances of resistors 28, 29 and 30 are also selected so as to cause the potential at the junction between resistors 29 and 30, i.e. on the minus input on amplifier 25, to define a suitable highest permissible limit value $U_2$ for the potential $u_{12}$ at terminal 12 when both transistors 13 and 14 are in a non-conducting state. The two amplifiers 24 and 25 are both arranged to deliver a low output signal as long as the potential on the plus input of each amplifier is lower than the potential on the minut input thereof. This means that the output signal from each amplifier will be low as long as the potential $u_{12}$ at terminal 12 lies between the two permitted limit values $U_1$ and $U_2$, i.e. as long as the condition $U_1 \leq u_{12} \leq U_2$ is met. As soon as the potential $u_{12}$ at terminal 12 exceeds the interval determined by limit values $U_1$ and $U_2$, the output signal from one of the two amplifiers will become high instead of low. Thus, if the potential $u_{12}$ for instance falls below the lower limit value $U_1$, i.e. $u_{12} < U_1$, the amplifier 24 will generate a high output signal. If the potential $u_{12}$ is raised above the upper limit value $U_2$, i.e. $u_{12} > U_2$, amplifier 25 will generate a high output signal. Thus, the sensing unit 35 will receive a low input signal as long as the potential $u_{12}$ lies within the permitted interval determined by limit values $U_1$ and $U_2$. However, it will receive a high input signal as soon as the potential $u_{12}$ assumes a value outside said interval. By appropriately selecting the two reference potentials $U_1$ and $U_2$ it is possible to ensure that the sensing unit will receive a low input signal as long as the two transistors 13 and 14 are non-conductive, while it will receive a high input signal as soon as any of said transistors is conductive, either due to a corresponding pilot signal supplied to the appurtenant base electrode terminal 18 or 19, respectively, or as a consequence of a short-circuiting in the transistor. Even if a live wire having such a potential that it may cause a considerable current through the load 10 should come into contact with the load or any of the wires connected thereto, the potential $u_{12}$ will assume a value outside the interval determined by $U_1$ and $U_2$ thereby causing a high input signal to sensing unit 35.

In order to make it possible to check that the monitoring equipment functions in an appropriate manner the sensing unit may be controlled or programmed to check that high input signals will occur not only when both transistors 13 and 14 are in a conducting state but also when the inductive load 10 generates a comparatively high counter electromotive force shortly after the moment when the current supply to the load has been broken, said electromotive force causing the potential $u_{12}$ to exceed the limit value $U_2$ for a short period of time.

In the embodiment illustrated in FIG. 2a, a bipolar electric load 40 is connected into a series circuit over two terminals 41 and 42. In addition to the load 40, said series circuit comprises two transistors 43 and 44, which are located on opposite sides of the load and function as switches, and two resistors 45 and 46, serving to limit the current through said transistors in case of any short-circuiting appearing in load 40. At its one end, said series circuit has a terminal 47, which is intended to be connected to the positive pole of a DC voltage source serving as a current supply for the load 40. The opposite end of said series circuit has a terminal 48, which is connected to earth. The negative pole of said DC voltage source should also be connected to earth. The base electrodes of transistors 43 and 44 are adapted to receive synchronous pilot signals P and N from two terminals 49 and 50. Each one of said terminals is connected to the base electrode of the appurtenant transistor via an optical insulator 51 and 52, respectively, and a transistor 53 and 54, respectively. The pilot signals P and N are supplied to terminals 49 and 50 from the two terminals 55 and 56 shown in FIG. 2b.

A resistor 57 is connected between the two terminals 41 and 47, parallel to transistor 43 and resistor 45, while a resistor 58 is connected between terminals 42 and 48, i.e. parallel to transistor 44 and resistor 46. Together with the load 40, the two resistors 57 and 58 form a voltage divider determining the potentials at the two poles of the load 40, i.e. at terminals 41 and 42, when the two transistors 43 and 44 are in a non-conducting state. Each resistor 57 and 58 has a resistance much higher than the resistance of load 40. Accordingly, the current through the load 40 will be very low when the two transistors 43 and 44 are non-conductive, meaning that the voltage drop across the load will be very low. The potentials at terminals 41 and 42 will then assume values very close to each other and determined by the resistance values of resistors 57 and 58.

Two inversed zener diodes 59 and 60 are connected in series with each other and parallel to the portion of the firstmentioned series circuit formed by load 40 amd resistors 45 and 46. The two diodes 59 and 60 serve to restrict the counter electromotive force generated in load 40 when the current supply to the load is broken by means of transistors 43 and 44.

The potential at each end of the load 40 is sensed by means of an equipment comprising two operational differential amplifiers 61 and 62. The minus input of amplifier 61 is connected to one end of load 40 over a resistor 63 (and resistor 45), while the plus input of amplifier 62 is connected to the other end of load 40 through a resistor 64 (and resistor 46). Reference numerals 65 and 66 designate two zener diodes which are connected each between one of said amplifier inputs and earth to limit the voltage at the amplifier inputs when the current supply to load 40 is broken by means of transistors 43 and 44. Resistors 63 and 64, in turn, serve to cause a voltage drop across the same and to limit the current through diodes 65 and 66. Reference numerals 67, 68, 69 and 70 designate four resistors which serve to generate suitable reference voltages to the plus input of amplifier 61 and the minus input of amplifier 62. Said resistors are arranged in two parallel series circuits 67, 69 and 68, 70, respectively, which are connected between earth and a terminal 71 intended to be connected to the positive pole of the DC voltage source previously mentioned.

Over a resistor 72 and 73, respectively, and an optical insulator 74 and 75, respectively, the output of each amplifier 61 and 62 is connected to a terminal 76 and 77, respectively. The two terminals 76 and 77 are connected to terminals 78 and 79, respectively, in FIG. 2b to supply them with signals corresponding to the output signals from amplifiers 61 and 62.

Amplifier 61 serves to sense the potential at the positive pole of load 40, which is connected to terminal 41, while amplifier 62 is intended to sense the potential at the negative pole of the load, which is connected to terminal 42. In principle, each amplifier 61 and 62 functions as a Schmitt-trigger circuit having a distinct transition point. The potential at the output of amplifier 61 will shift from a high to a low level when the potential on the minus input of said amplifier becomes higher than the potential on the plus input of the amplifier, which occurs as soon as transistor 43 becomes conductive. In similar manner, the potential at the output of amplifier 62 will shift from a high to a low level when the potential on the plus input of said amplifier becomes lower than the potential on the minus input. The resistances of resistors 67, 68, 69 and 70 are selected so as to cause the potential on the plus input of amplifier 61 to assume a value slightly above the potential existing at terminal 41 when the two transistors 43 and 44 are conductive, and the potential on the minus input of amplifier 62 to assume a value slightly below the potential then existing at terminal 42.

Figure 2B:
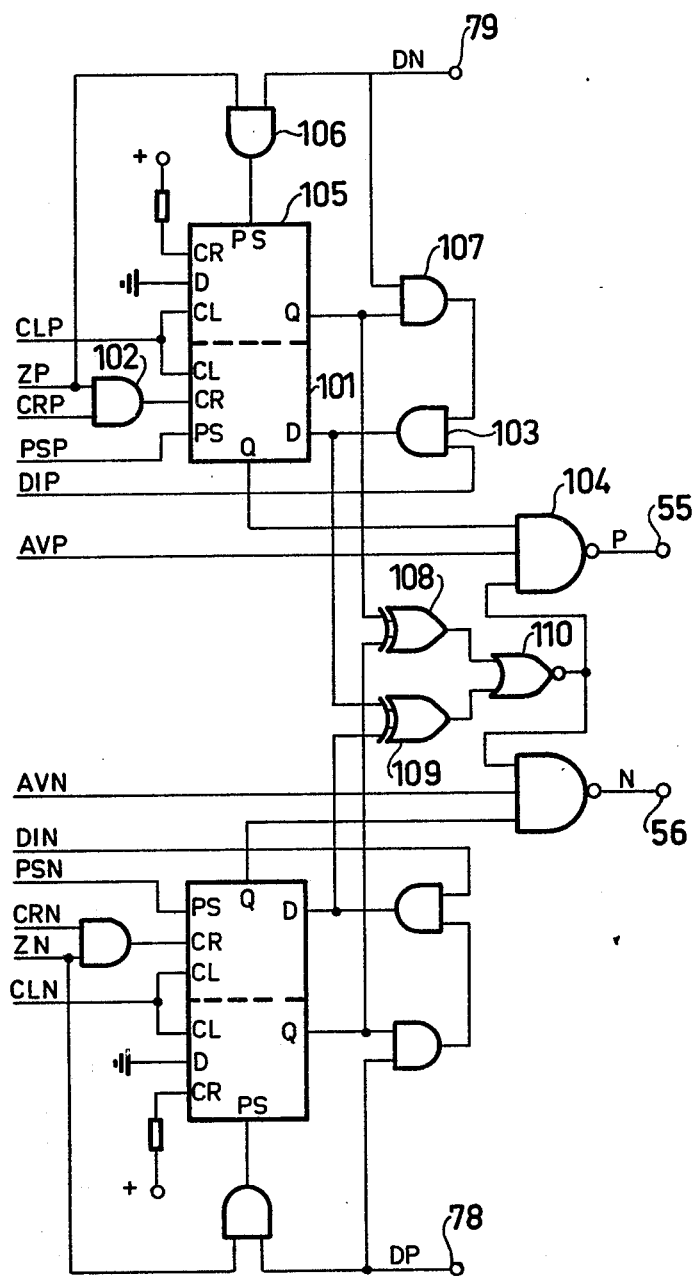

FIG. 2b shows the logical circuit system serving to generate the required pilot or control signals P and N to the two switch transistors 43 and 44 and to monitor the operation and function of said transistors. The system is divided into two channels, one of which controls and monitors transistor 43, while the other channel serves to control and monitor transistor 44. Since the two channels are of mutually equal construction, only one of them will be described in greater detail, viz. the channel serving to control and monitor transistor 43. The pilot signal generating portion of said channel comprises a D flip-flop 101, an AND gate 102, an AND gate 103, and a NAND gate 104. The monitoring portion comprises a D flip-flop 105, an AND gate 106, and an AND gate 107.

In addition to said components of each channel the logical circuits shown in FIG. 2b also include means for monitoring the synchronous operation of the two channels. Said means consist of two EXCLUSIVE OR gates 108 and 109, and a NOR gate 110. It may be assumed that the load 40 is formed by the winding of a solenoid valve serving as control means for a press or other cyclically operating machine. It may further be assumed that said machine is in its starting position for running through an operating cycle. All blocking functions are then high, i.e. ZP, CRP, DIP and AVP are high. Also PSP is high. When the operator manually initiates an operating cycle, CLP will shift from its pervious high level to a low level. This will cause the Q output of flip-flop 101 to assume the condition prevailing at the D input at the clocking moment. If, as assumed above, the blocking signal DIP is high and the two transistors 43 and 44 are in a non-conducting state and, additionally, the Q-output signal from flip-flop 105 is high, the D-input signal of flip-flop 101 will be high at the clocking moment. The Q output of flip-flop 101 will then deliver a high output signal causing the pilot signal P fed to transistor 43 via terminals 55 and 49 to become low. In corresponding manner, the other channel will generate a low pilot signal N to transistor 44 via terminals 56 and 50. The two transistors 43 and 44 will hereby shift from a non-conducting to a conducting state and cause an actuation of the magnetic valve. Flip-flop 105 was clocked simultaneously with flip-flop 101. Since the D input of flip-flop 105 is connected to earth and, hence, is held on a low potential, a low signal will be generated on the Q output from said flip-flop. However, this does not influence flip-flop 101, since this flip-flop is sensitive only for the condition prevailing at its D input at the clocking moment, which took place shortly before the condition at the D input was changed through the influence of flip-flop 105. When the solenoid valve is actuated, the two signals DP and DN delivered from the arrangement shown in FIG. 2a are shifted from a high to a low level. This means that the signal on PS input of flip-flop 105 will become low. Flip-flop 105 is hereby preset, meaning the Q-output signal of said flip-flop will become high. This results in that the D input of flip-flop 101 will again receive a high input signal.

When the solenoid valve was actuated, the machine started an operating cycle. The course above described, during which the Q output of flip-flop 105 shifts from a high to a low and then back to a high level, takes only a few microseconds. If the operator now releases the manual control, CRP will go low. This causes the Q output of flip-flop 101 to go low. Both transistors 43 and 44 will then be cut off and shift to a non-conducting state. The machine may then be restarted from the position reached, in the same manner as it was previously started from the original starting position. The machine can be stopped in any position causing CRP to shift to a low level. When the press later on has reached a position where, for safety reasons, it is no longer required that it should be stopped as soon as the operator releases the normal manual control, PSP will shift to a low level.

The PS input of flip-flop 101 will now receive a low input signal, meaning that the Q output will go high, irrespectively of the condition at the CR input, the D input and the CL input. The press can then not be stopped simply by releasing the normal manual control. However, by means of a special control the operator may stop the press by causing AVP to shift to a low level.

If any of the two transistors 43 and 44 is in a conducting state when a starting signal is received on CLP, the Q output from flip-flop 101 will not shift to a high level, as the D input is low. Thus, the press cannot be started.

Gate 108 serves to monitor that flip-flop 105 operates in synchronism with the corresponding flip-flop of the other channel, while gate 109 serves to control that flip-flop 101 operates in synchronism with the corresponding flip-flop of the other channel. If the required synchronism does not exist, gate 110 will generate a low output signal, causing a high output signal from gate 104 and the corresponding gate of the other channel. The two transistors 43 and 44 will then immediately shift to a non-conducting state and break the current supply to the winding of the solenoid valve.

I claim:

1. An electric switch arrangement for use as a current supply switching means for a bipolar electric load, said arrangement being of the kind comprising two switches which are connected in series with each other and with the load and which are located on opposite sides of the load, characterized by a monitoring equipment for supervising the operation and function of said switches, said monitoring equipment comprising potential generating means for generating at each pole of the load, when both said switches are open, a potential deviating from the potential existing at said each pole when anyone of said switches is closed or both said switches are closed, and sensing means directly connected to said load for sensing the potential of at least one of the poles of the load.

2. An electric switch arrangement according to claim 1, characterized in that said potential generating means include a voltage dividing circuit in which the load is connected.

3. An electric switch arrangement according to claim 1, characterized in that the sensing means include reference potential means for generating at least one reference potential and comparator means for comparing the sensed potential of at least one pole of the load with the reference potential.

4. An electric switch arrangement according to claim 1, characterized by means for checking the function of the monitoring equipment.

5. An electric switch arrangement according to claim 4, characterized in that said checking means is connected to control the current through said load.

* * * * *